United States Patent [19]
Von Bunau et al.

[11] Patent Number: 5,863,712
[45] Date of Patent: Jan. 26, 1999

[54] PATTERN FORMING METHOD, PROJECTION EXPOSURE SYSTEM, AND SEMICONDUCTOR DEVICE FABRICATION METHOD

[75] Inventors: Rudolf Murai Von Bunau; Hiroshi Fukuda, both of Kodaira, Japan

[73] Assignee: Hitachi, Ltd., Tokyo, Japan

[21] Appl. No.: 779,329

[22] Filed: Jan. 6, 1997

[30] Foreign Application Priority Data

Jan. 16, 1996 [JP] Japan .................................. 8-004942

[51] Int. Cl.⁶ ...................................................... G03C 5/04
[52] U.S. Cl. ........................ 430/396; 430/311; 430/394; 430/397; 355/53; 355/71; 355/77; 355/63
[58] Field of Search ................................... 430/311, 394, 430/396, 397; 355/53, 71, 77, 63

[56] References Cited

U.S. PATENT DOCUMENTS

| | | | |
|---|---|---|---|
| 4,012,137 | 3/1977 | Goren | 355/4 |
| 4,860,059 | 8/1989 | Terashita | 355/38 |
| 5,316,896 | 5/1994 | Fukuda et al. | 430/322 |
| 5,595,857 | 1/1997 | Fukuda et al. | 430/311 |
| 5,610,684 | 3/1997 | Shiraishi | 355/55 |
| 5,677,757 | 10/1997 | Taniguchi et al. | 355/71 |

FOREIGN PATENT DOCUMENTS 562133  9/1993  European Pat. Off. .......... G03F 7/20

OTHER PUBLICATIONS

M.D. Levenson et al, "Improving Resolution in Photolithography with a Phase–Shifting Mask", IEEE Transaction on Electron Devices, vol. Ed–29, No. 12, Dec. 1982, pp. 1828–1836.

K. Toh et al, "Chromeless Phase–Shifted Masks: A New Approach to Phase–Shifting Masks", SPIE vol. 1496, 10th Annual Symposium on Microlithography, 1990, pp. 27–53.

M. Noguchi et al, "Resolution Enhancement of Stepper by Complementary Conjugate Spatial Filter", SPIE vol. 1674, Optical/Laser Microlithography, 1992, pp. 662–668.

H. Fukuda et al, Evaluation of Pupil–Filtering in High–Numerical Aperture I–Line Lens, Japanese Journal Of Applied Physics, vol. 32, Part 1, No. 12B, Dec. 1993, pp. 5845–5849.

S. Orii et al, "Quarter Micron Lithography System with Oblique Illumination and Pupil Filter", SPIE vol. 2197, pp. 854–868.

(List continued on next page.)

Primary Examiner—Nam Nguyen
Assistant Examiner—Steven H. VerSteeg
Attorney, Agent, or Firm—Fay, Sharpe, Beall, Fagan, Minnich & McKee

[57] ABSTRACT

The pattern forming method is capable of forming a projected image or photoresist pattern that is faithful to a designed pattern without performing complex correction of a mask pattern. A projection exposure system and a semiconductor device fabrication method employing this pattern forming method are also disclosed. Exposure is performed by setting a pupil filter with a variable amplitude transmittance to the pupil position of the projection lens of a projection exposure system. The pupil filter has a transparent substrate, a phase retarding layer, a translucent film, and an opaque stencil. The pupil filter is replaced or rotated during either a plurality of exposures or during a single exposure onto the same position on the surface of a wafer substrate that is to be exposed. It is possible to improve the fidelity of the contour of a pattern transferred image without improving the numerical aperture (NA) of a projection lens, decreasing the wavelength of exposure light, or locally correcting a mask pattern. It is also possible to prevent imperfect resolution from occurring and fabricate semiconductor integrated circuit devices with a high yield.

20 Claims, 16 Drawing Sheets

OTHER PUBLICATIONS

R. von Bunau et al, "Effects of Radially Non–Symmetric Pupil Filters and Multiple–Pupil Exposure", SPIE vol. 2726, pp. 375–385.

R. von Bunau et al, "Printing Isolated Features with k1=0.2 Using Multiple–Pupil Exposure", SPIE 2726, 1996.

S. Vaidya et al, "Optical Proximity Correction—Promise and Pitfalls", 19A–3–1, pp. 138–139.

N. Shiraishi et al, "New Imaging Technique for 64M–DRAM", SPIE vol. 1674, Optical/Laser Microlithography V, 1992 pp. 741–752.

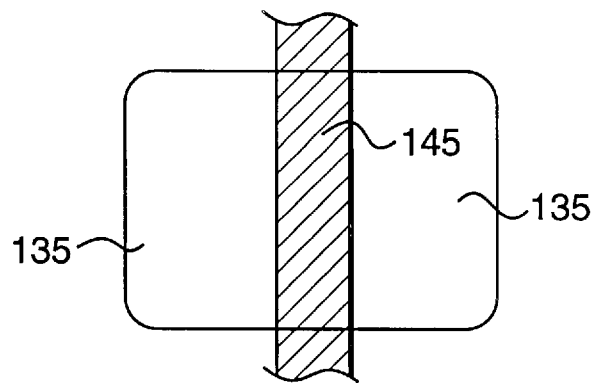
FIG. 13(a)
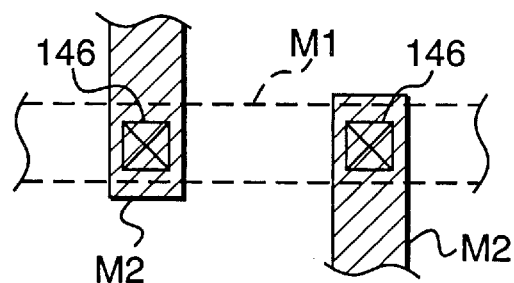
FIG. 13(b)
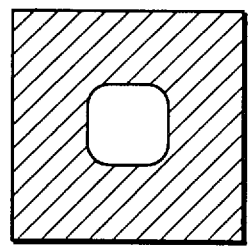 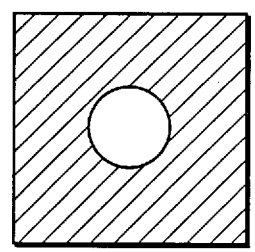
FIG. 14(a)   FIG. 14(b)

PATTERN FORMING METHOD, PROJECTION EXPOSURE SYSTEM, AND SEMICONDUCTOR DEVICE FABRICATION METHOD

FIELD OF THE INVENTION

The present invention relates to a pattern forming method, a projection exposure system, and a semiconductor device fabrication method. In particular, the present invention relates to a pattern forming method for forming fine patterns of various types of solid-state devices, a projection exposure system used for the pattern forming method, and a semiconductor device fabrication method employing the pattern forming method.

BACKGROUND OF THE INVENTION

In general, improvement of the integration density of semiconductor integrated circuits in recent years has been achieved mainly through a reduction in size of the various circuit patterns. These circuit patterns are presently formed mainly by optical lithography processes using a wafer stepper.

FIG. 1 shows the structure of such a prior art stepper. Mask 14 is illuminated by the light emitted from illumination system 11. An image of mask 14 is projected onto a photoresist film coated on wafer 19 which is the substrate to be exposed through projection system 15. As shown in FIG. 1, illumination system 11 includes a source 10, condenser lens 12, and aperture 13 for specifying the shape and size of the effective source. Projection system 15 includes a projection lens 16, pupil filter 17, and aperture 18 arranged in or near the pupil plane of projection lens 16 to set the numerical aperture (NA) of the lens.

The minimum feature size R of patterns transferable by an optical system is approximately proportional to the wavelength $\lambda$ of the light used for exposure and inversely proportional to the numerical aperture (NA) of the projection optical system. Therefore, size R is expressed as $R=k_1\lambda/NA$, where $k_1$ is an empirical constant and $k_1=0.61$ is referred to as the Rayleigh limit.

As shown by the above expression, the resolution (minimum feature size R) can be increased by decreasing wavelength $\lambda$ or by increasing the numerical aperture NA. In the past, both approaches have been taken. However, it has recently become difficult to decrease the wavelength further, because of the limited availability of optical materials. Also, lens design issues set a limit to further increases in the numerical aperture. Therefore, pattern dimensions of integrated circuits are now at or near the limit of resolution of the projection exposure system used to define them.

In general, when the pattern dimensions approach the Rayleigh limit, the projected image is no longer a faithful reproduction of the mask pattern shape. This phenomenon is known as optical proximity effects and results in corner rounding, line-end shortening, and line width errors, among other things. To solve this problem, algorithms have been proposed that can be used to pre-distort the mask pattern so that the shape of a projected image takes on the desired shape.

Moreover, approaches have been described which improve the resolution limit of a given optical system, resulting effectively in a decreased value of $k_1$. Adoption of a phase shifting mask is a typical example of this approach. A phase shifting mask is used to provide a phase difference between adjacent apertures of a conventional mask. Examples of this technique are shown by Mark T. Levenson et al. in an article entitled "Improving Resolution in Photolithography with a Phase-Shifting Mask" in IEEE, Trans. on Electron Devices, Vol. ED-29, No. 12, pp. 1828–1836 (1982)".

A chromeless phase shifting mask method is known as a phase shifting method suitable for the transfer of a fine isolated opaque line pattern, which is needed, for example, for the gate pattern of a logic LSI. A mask used according to this method uses a transparent layer to provide a phase difference of 180° in a transparent area. A very narrow dark line on a bright background is formed along the outline of the transparent layer. This chromeless phase shifting mask method is taught by Toh et al in an article entitled "Chromeless Phase-Shifted Masks: A New Approach to Phase-Shifting Masks" in SPIE vol. 1496 10th Annual Symposium on Microlithography, pp. 27–53 (1990).

An off-axis illumination method and a pupil filtering method are also known methods for improving images. According to the off-axis illumination method, the transmittance of aperture 13 is modified in the illumination system 11 of FIG. 1. One particular embodiment of this method changes the illumination intensity profile so that the transmittance at the margin becomes larger than that of the central portion, which is particularly effective to improve the resolution of a periodic pattern and the depth of focus. The pupil filtering method is a method of performing exposure through a filter (pupil filter) located at the pupil position of a projection lens to locally change the amplitude and phase of the transmitted light. For example, this approach makes it possible to greatly increase the depth of focus of an isolated pattern. The off-axis illumination method is, for example, discussed by Noguchi et al. in an article entitled "Resolution Enhancement of Stepper by Complementary Conjugate Spatial Filter" in SPIE vol. 1674 Optical/Laser Microlithography V, pp. 662–668 (1992). The pupil filtering method is disclosed by Fukuda et al. in the Jpn. J. Appl. Phys. 32 (1993) pp. 5845–5849. Furthermore, it is shown in an article by Orii et al., entitled "Quarter Micron Lithography System with Oblique Illumination and Pupil Filter", SPIE vol. 2197 pp. 854–868 (1994), and shown in European Patent Publication No. 0562133 A1 (1993), that the resolution of a periodic pattern can further be improved by combining the off-axis illumination method and the pupil filtering method.

SUMMARY OF THE INVENTION

The present inventors have recognized that in order to apply optical proximity effect correction to an actual pattern, large amounts of calculation time are required for complex circuit patterns. Moreover, typically a large number of correction patterns are necessary, thereby greatly increasing the amount of pattern data required for making a mask.

The chromeless phase shifting method increases the complexity of the exposure process, because dark lines are formed along the outline of the shifter areas. Therefore, exposure must be performed twice with different masks in order to form only the desired line pattern. Image improving methods combining the off-axis illumination method and the pupil filtering method have been proposed by Orii et al. and EP 0562133 A1 to Sandstrom, as mentioned above in the Background section. In the case of the method proposed by Orii et al., however, the number of patterns to be accurately transferred is limited because imaging properties are asymmetric. The method proposed by Sandstrom has practical problems in that not only is the image contrast low, but it is also necessary to rotate the pupil filter during exposure.

It is the first object of the present invention to solve the above-mentioned problems of the prior art and provide a novel pattern forming method capable of forming a projected image or resist pattern very close to the shape of a circuit design pattern even when using a conventional mask having the same pattern as the circuit design pattern without performing complex mask correction. This object also includes improving the fidelity of the pattern shape with respect to corner rounding and line width errors and providing a projection exposure system used for this pattern forming method.

It is another object of the present invention to provide a novel pattern forming method capable of forming a very fine pattern with a high accuracy without using a phase shifting mask or multiple exposure using two or more different masks and to provide a projection exposure system used for this pattern forming method.

It is still another object of the present invention to provide a semiconductor device fabrication method capable of forming various patterns with a high accuracy and without increasing the number of process steps.

In order to solve the above-mentioned problems and satisfy the above-mentioned objects, the present invention uses a method of exposing a mask pattern onto a substrate through a projection lens and transferring the pattern onto the substrate. The mask is illuminated almost perpendicularly from the top and exposure of the same pattern to the same position on the substrate surface is performed by changing the transmittance of the pupil filter located at the pupil position of the projection lens. At least one of the pupil functions has an amplitude transmittance distribution that is asymmetric with respect to the pupil center.

A preferred embodiment is obtained when the pupil functions include pupil function $A_1$ and pupil function $A_2$ which satisfy the following relations.

$$A_1(X, Y)=A_1(-X, Y)=A_1(X, -Y)=A_1(-X, -Y)$$

$$A_2(X, Y)=-A_2(-X, Y)=-A_2(X, -Y)=A_2(-X, -Y)$$

(In the above expressions, X and Y denote orthogonal axes in the pupil plane with the optical axis as the origin.)

A satisfactory result is obtained when the pupil function $A_1(X, Y)$ takes the value 1 in the whole pupil area, the pupil function $A_2(X, Y)$ takes any one of values 1, 0, and −1 in the pupil plane of the projection lens, and the area for which $A_2(X, Y)=0$ has approximately the shape of a cross, covering the image of the effective source in the pupil plane.

A preferred embodiment is obtained when the pupil functions include pupil function $B_1$ and pupil function $B_2$ satisfying the following relations.

$$B_1(X, Y)=B_1(Y, X)=B_1(-Y, -X)$$

$$B_2(X, Y)=B_1(-Y, X)$$

(In the above expressions, X and Y denote orthogonal axes in the pupil plane with the optical axis as the origin.)

A satisfactory result is obtained when the pupil function $B_1(X, Y)$ takes any one of the values 1, 0.5, and 0 in the pupil plane and the area for which $B_1(X, Y)=0.5$ covers the image of the effective source in the pupil plane.

A satisfactory result is also obtained when the pupil function $B_1(X, Y)$ takes the value 1 or 0 in the pupil area and the area for which $B_1(X, Y)=0$ is arranged symmetrically with respect to the pupil center.

A preferred embodiment is obtained when the pupil functions include pupil functions $C_1$, $C_2$, and $C_3$ satisfying the following relations.

$$C_1(X, Y)=C_1(-X, Y)=C_1(X, -Y)=C_1(-X, -Y)$$

$$C_2(X, Y)=-C_2(-X, Y)=C_2(X, -Y)$$

$$C_3(X, Y)=C_2(-Y, X)$$

(In the above expressions, X and Y denote orthogonal axes in the pupil plane with the optical axis as the origin.)

A satisfactory result is obtained when the pupil function $C_1(X, Y)$ takes the value 1 in the whole pupil area, the pupil function $C_2(X, Y)$ takes any one of values 1, 0, and −1, and the area for which $C_2(X, Y)=0$ has the shape of a stripe, covering the image of the effective source in the pupil plane.

A preferred embodiment is obtained when the pupil functions include pupil functions $D_1$, $D_2$, $D_3$, and $D_4$ satisfying the following relations.

$$D_1(X, Y)=D_1(Y, X)$$

$$D_2(X, Y)=D_1(-Y, X)$$

$$D_3(X, Y)=D_1(-X, -Y)$$

$$D_4(X, Y)=D_1(Y, -X)$$

(In the above expressions, X and Y denote orthogonal axes in the pupil plane with the optical axis as the origin.)

A satisfactory result is obtained when the pupil function $D_1(X, Y)$ takes any one of values 1, 0.5, and 0 and the area for which $D_1(X, Y)=0.5$ covers the image of the effective source in the pupil plane.

The exposure can be performed by using a variable off-axis illuminator capable of producing a different effective source distribution for each pupil function.

The pupil functions can be set by providing a pupil filter in which a film selected out of a group of a film opaque to the light, a film for partially absorbing the light, and a film for phase-retarding the light is locally set on a transparent substrate almost on the pupil plane of the projection lens.

The projection exposure can be performed by changing the pupil filters having amplitude transmittance distributions different from each other during a plurality of exposures or during a single exposure applied to the same position on the substrate surface. Also, the projection exposure can be performed by rotating the pupil filter having one amplitude transmittance distribution during a plurality of exposures or during a single exposure applied onto the same position on the substrate surface.

The different pupil functions can be set by providing a filter in which a film selected out of a group of a film opaque to the light, a film for partially absorbing the light, and a film for phase-retarding the light is locally set on a transparent substrate and a stencil mask opaque to the light is provided near the pupil plane of the projection lens.

The projection exposure can be performed by rotating the stencil mask during a plurality of exposures or during a single exposure onto the same position on the substrate surface.

Since a filter in which a film selected out of a film opaque to the light, a film for partially absorbing the light, and a film phase-retarding the light is locally set onto an optically birefringent substrate and is formed almost on the pupil plane of the projection lens, projection exposure can be performed by rotating the direction of polarization of the light during a plurality of exposures or during a single exposure onto the same position on the substrate surface.

Moreover, the above-mentioned objects of the present invention can be achieved by a projection exposure system having a source, a mask stage for mounting a mask, an illumination optical system for applying the light emitted from the source onto the mask, a wafer stage for mounting a wafer, a projection optical system for projection-exposing the light passing the mask to the wafer, a pupil filter or stencil filter arranged almost nearby the pupil of the projection optical system, and means for replacing or rotating the pupil filter or stencil filter during a plurality of exposures during a single exposure onto the same position on the surface of the wafer.

Furthermore, in a method for projection-exposing a predetermined pattern formed on a mask to a principal plane of a semiconductor substrate through a projection lens and transferring the pattern to the principal plane of the semiconductor substrate, a semiconductor device can be fabricated by illuminating the mask from a direction almost perpendicularly above the mask and arranging pupil filters having a plurality of pupil functions different from each other on the pupil plane of the projection lens and performing the exposure onto the same position of the same pattern on the substrate surface.

In this case, the mask pattern can be used as a contact-hole or via-hole pattern of a MOS LSI and therefore, a preferable result can be obtained.

It should be noted that other objects, features and advantages of the present invention will be readily apparent in view of the following detailed description of the preferred embodiments.

BRIEF DESCRIPTION OF THE DRAWINGS

FIG. 13(a) and 13(b) are illustrations showing a layout of a mask pattern for fabricating a semiconductor integrated circuit device;

FIGS. 14(a) and 14(b) are illustrations of contours of formed resist patterns;

DETAILED DESCRIPTION OF THE PREFERRED EMBODIMENTS

The present invention will now be described in conjunction with the accompanying drawings.

Figure 2A:
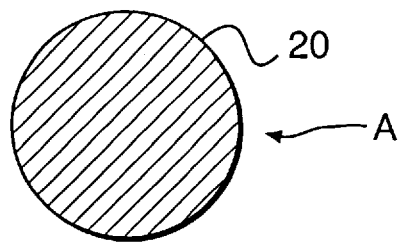
FIG. 2(a) to 2(d) are illustrations showing basic pupil functions used in the present invention.

FIGS. 2(a) to 2(d) show four different pupil functions A, B, C, and D. FIG. 2(a) shows a four-fold symmetric pupil function A having a positive transmittance everywhere within the pupil area 20.

Figure 2B:
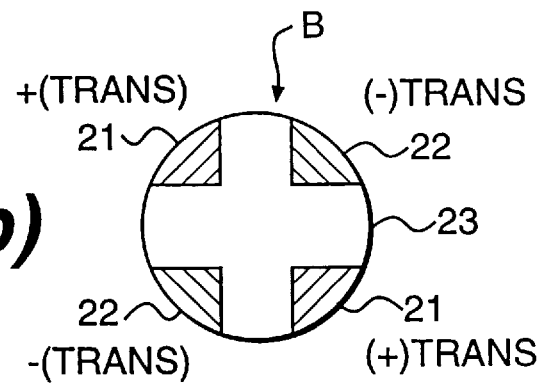

In the case of pupil function B shown in FIG. 2(b), the top-left and the bottom-right quadrants 21 have a positive transmittance and the top-right and the bottom-left quadrants 22 have a negative transmittance in a bright background. Cross-shaped area 23 in the middle is completely opaque and its width corresponds to the diameter of the image of the effective source in the pupil plane. Pupil function B is symmetric with respect to axes obtained by rotating the X and Y axes by 45° about the center of the pupil plane and it is anti-symmetric with respect to the X and Y axes.

Figure 2C:
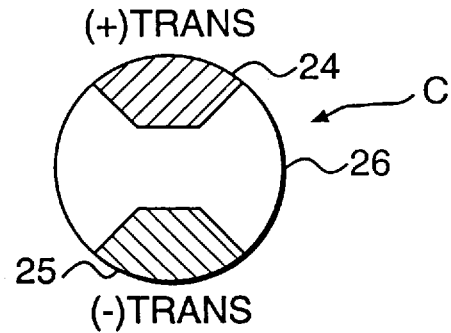

In the case of pupil function C shown in FIG. 2(c), upper-half area 24 has a positive transmittance and lower-half area 25 has a negative transmittance. Stripe-shaped area 26 in the middle is completely opaque and its width is equal to or larger than the diameter of the image of the effective source in the pupil plane. Pupil function C is symmetric with respect to the Y axis and anti-symmetric with respect to the X axis.

Figure 2D:
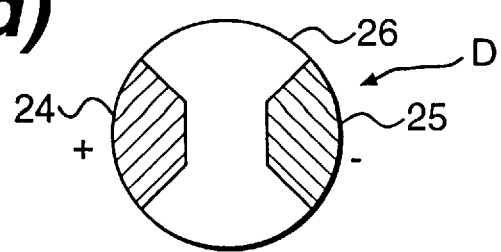

Finally, pupil function D shown in FIG. 2(d) is obtained by rotating pupil function C by 90° about the pupil center.

Figure 3A:
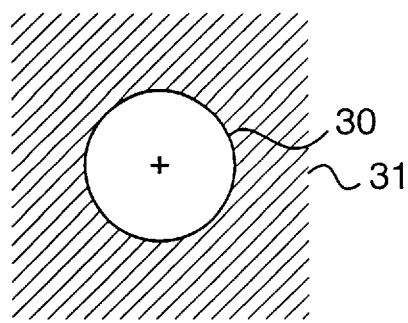
FIGS. 3(a) to 3(d) are illustrations showing qualitative amplitude distributions of point images obtained by using the pupil functions shown in FIG. 2.

Amplitude point spread functions obtained by using pupil functions A to D shown in FIGS. 2(a) to 2(d) are shown schematically in FIGS. 3(a) to 3(d). Because the amplitude point spread functions are obtained via a two-dimensional Fourier transform of the pupil function, they have the same symmetry as the pupil functions. The amplitude point spread function corresponding to pupil function A, as shown in FIG. 3(a), consists primarily of a bright spot 30 of uniform phase in a dark background 31.

Figure 3B:
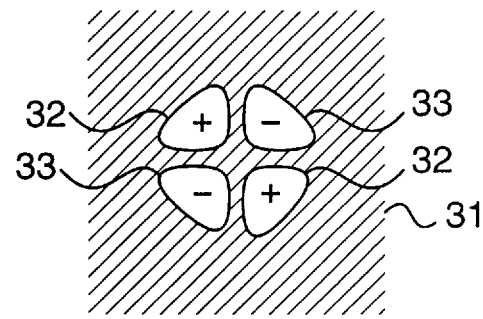

In the case of the amplitude point spread function corresponding to pupil function B, as shown in FIG. 3(b), four peaks 32 and 33 appear which are separated by dark lines along the X and Y axes. In FIG. 3(b), peaks 32 shown at the top left and the bottom right of the figure are opposite in phase to peaks 33 shown at the top right and the bottom left.

Figure 3C:
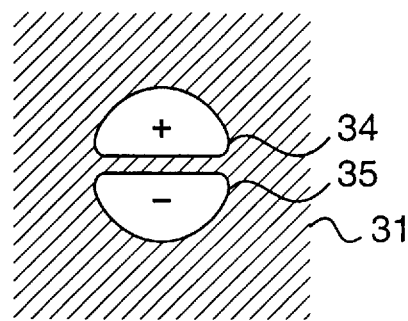

In the amplitude point spread function corresponding to pupil function C, two peaks 34 and 35 separated by a horizontal dark line appear, as shown in FIG. 3(c). In FIG. 3(c), upper peak 34 is opposite in phase to lower peak 35.

Figure 3D:
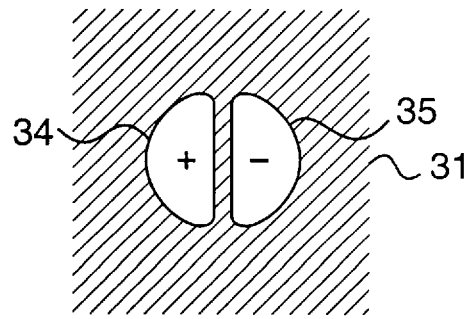

The amplitude point spread function corresponding to pupil function D, as shown in FIG. 3(d), is the same as that obtained by rotating the distribution shown in FIG. 3(c) by 90° about the pupil center. In FIG. 3(d), left peak 34 is opposite in phase to right peak 35.

Therefore, by properly combining and using pupil functions A, B, C, and D, it is possible to image various fine patterns with a high degree of accuracy.

Figure 4A:
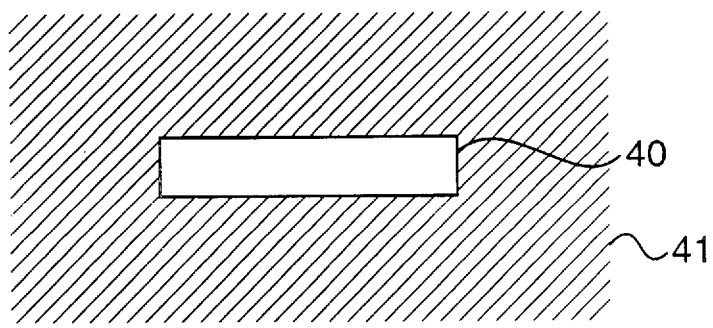
FIGS. 4(a) to 4(d) are illustrations explaining the shape of the projected images when transferring dark-field patterns using the present invention.
Figure 4B:
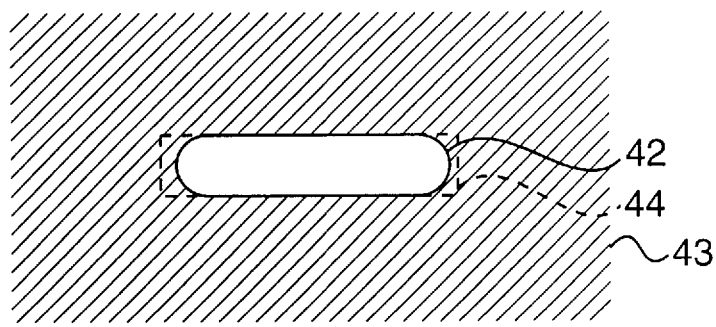

FIG. 4(a) illustrates the case of imaging a mask pattern consisting of a bright horizontal line segment 40 onto an opaque background 41 by combining and using pupil functions A and B as described below. By using pupil function A in which the whole pupil area 20 has positive transmittance for the pattern shown in FIG. 4(a), the projected image shown qualitatively in FIG. 4(b) is obtained. This projected image is an image in which bright line image 42 is in dark area 43. When the width of image 42 becomes close to the resolution limit of a protection optical system, resulting image 42 will suffer from line-end shortening and its corners will be rounded compared to the mask-pattern outline 44.

Figure 4C:
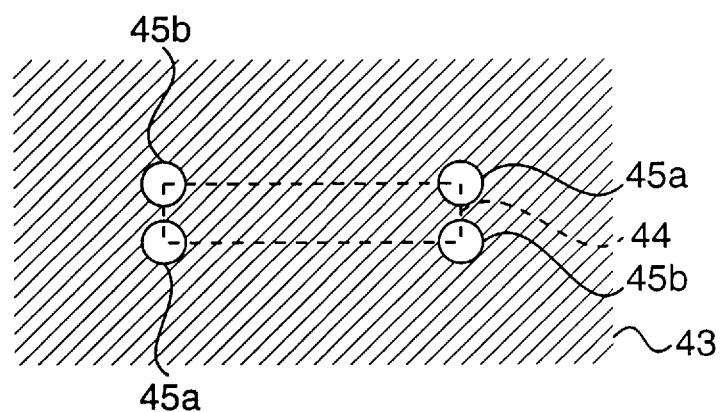

By using pupil function B, the projected image shown qualitatively in FIG. 4(c) is obtained. In this case, because cross-shaped opaque area 43 is present in the pupil plane, the light transmitted through the central portion of the mask feature and the light diffracted by the edge of the feature are blocked by the pupil filter and only the light diffracted by the corners of the pattern passes through the pupil plane and reaches the image plane. However, as shown in FIG. 3(b), in the case of pupil function B, the amplitude point spread functions are anti-symmetric. Therefore, light spots 45a produced at the top right and the bottom left are opposite in phase to light spots 45b produced at the top left and the bottom right. Therefore, adjacent corners are always separated by a dark area.

Figure 4D:
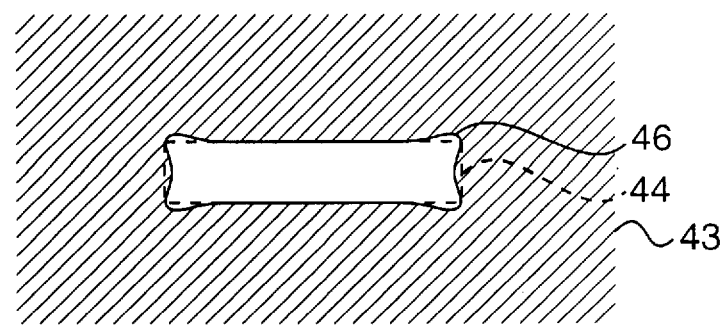

Therefore, by adding the exposure with pupil function B to the exposure with pupil function A, the image shown in FIG. 4(d) is obtained whose corners 46 are highlighted. The same effect is obtained for a line pattern in the perpendicular direction or a square pattern.

Figure 5A:
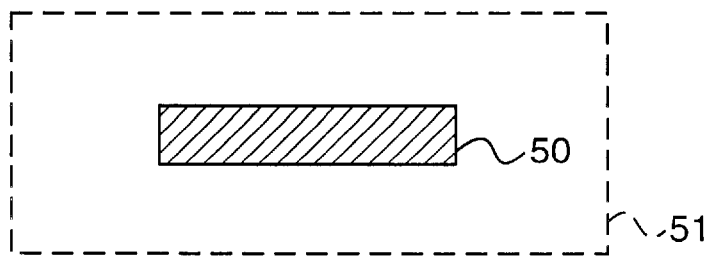
FIGS. 5(a) to 5(e) are illustrations explaining the shape of the projected images when transferring bright-field patterns by the present invention.
Figure 5B:
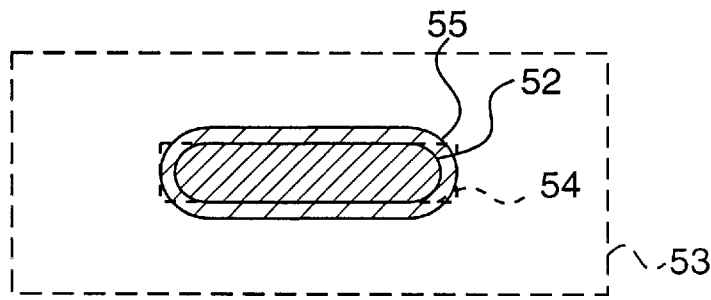

Conversely to FIG. 4(a), FIG. 5(a) illustrates a mask pattern in which an opaque line segment 50 is formed in a bright background 51, by using mask patterns A, C, and D. By performing an exposure with pupil function A, the projected image in which dark image 52 is formed in bright area 53 is obtained as shown in FIG. 5(b). If the line width is close to the resolution limit of the projection system and image 52 is formed by adjusting the exposure dose so that the width of the projected image is equal to the width of the original pattern outline 54 shown by a broken line, the line ends of image 52 will be shortened and the corners will be rounded. When exposure is performed so that the length of image 52 becomes equal to original pattern outline 54, an image 55, having a width larger than the width of the original pattern outline 54, is formed.

Therefore, it is difficult to form a pattern whose width and length are equal to design dimensions and whose corners are not rounded. However, if it is possible to decrease the line width while keeping the length constant it is clear that line ends of an image can be prevented from shortening.

Figure 5C:
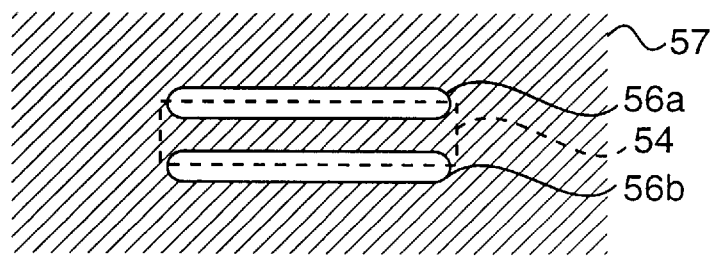

When exposure is performed using pupil function C, narrow bright lines 56a and 56b are formed along the horizontal edges as shown in FIG. 5(c). This is because, as shown in FIG. 2(c), stripe-shaped opaque area 26 is present in the pupil plane of pupil function C and therefore, the undiffracted background component and the light diffracted at the vertical edges of the pattern do not pass through the pupil but only the light diffracted at the horizontal edges and pattern corners reaches the image plane. Thus, background 57 becomes dark.

Because a print image obtained by pupil function C has the anti-symmetry shown in FIG. 3(c), the upper bright line (edge image) 56a shown in FIG. 5(c) is opposite in phase to lower bright line (edge image) 56b and these bright lines 56a and 56b are separated from each other. Therefore, by adding the exposure using pupil function C to the exposure using pupil function A, it is possible to decrease the line width while keeping the length constant.

However, to obtain the same effect also for a vertically-oriented line pattern, an exposure using pupil function D, obtained by rotating pupil function C by 90° must be performed. In this case, the projected image according to pupil function D consists of bright lines 58a and 58b along the vertical edges of the line pattern as shown in FIG. 5(d).

Figure 5D:
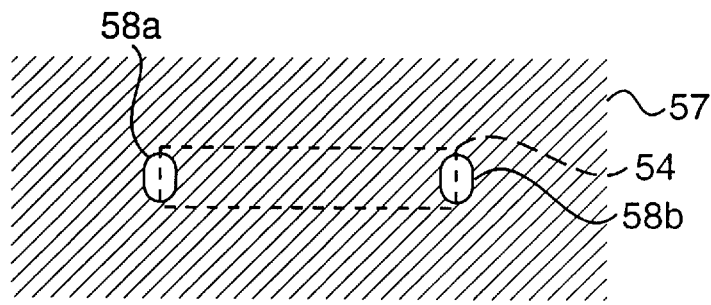
Figure 5E:
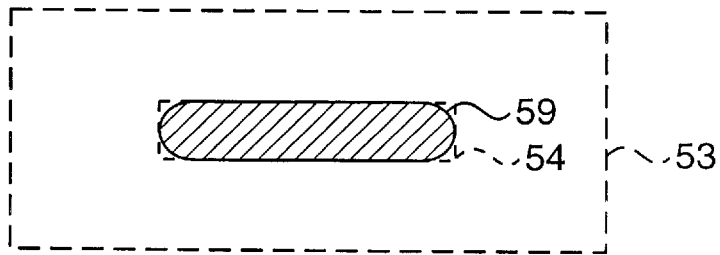

However, when forming a horizontally-oriented line pattern whose line width is close to the resolution limit of a projection optical system, the maximum light intensity of the projected image shown in FIG. 5(d) is very small compared to the case of FIG. 5(c) because vertical edges are very short. Therefore, by performing the exposure using pupil function C and the exposure using pupil function D with an equal exposure value and adding both types of exposure to the image obtained by pupil function A, contraction of line ends of the line image is decreased and the width of the line image can be decreased. Therefore, as shown in FIG. 5(e), summed image 59 can be obtained whose length and width coincide with the length and width of original feature outline 54. It is needless to say that the same can be applied to a vertically-oriented opaque pattern.

When an L-shaped opaque line is present in the bright background, the added light intensity of the inside corner of the L-shaped opaque pattern is larger than at the outside convex corner of the pattern when images obtained by using pupil functions C and D are added to an image obtained by pupil function A to form a summed image. Therefore, also in this case, a summed image with a high pattern fidelity is obtained.

Figure 15:
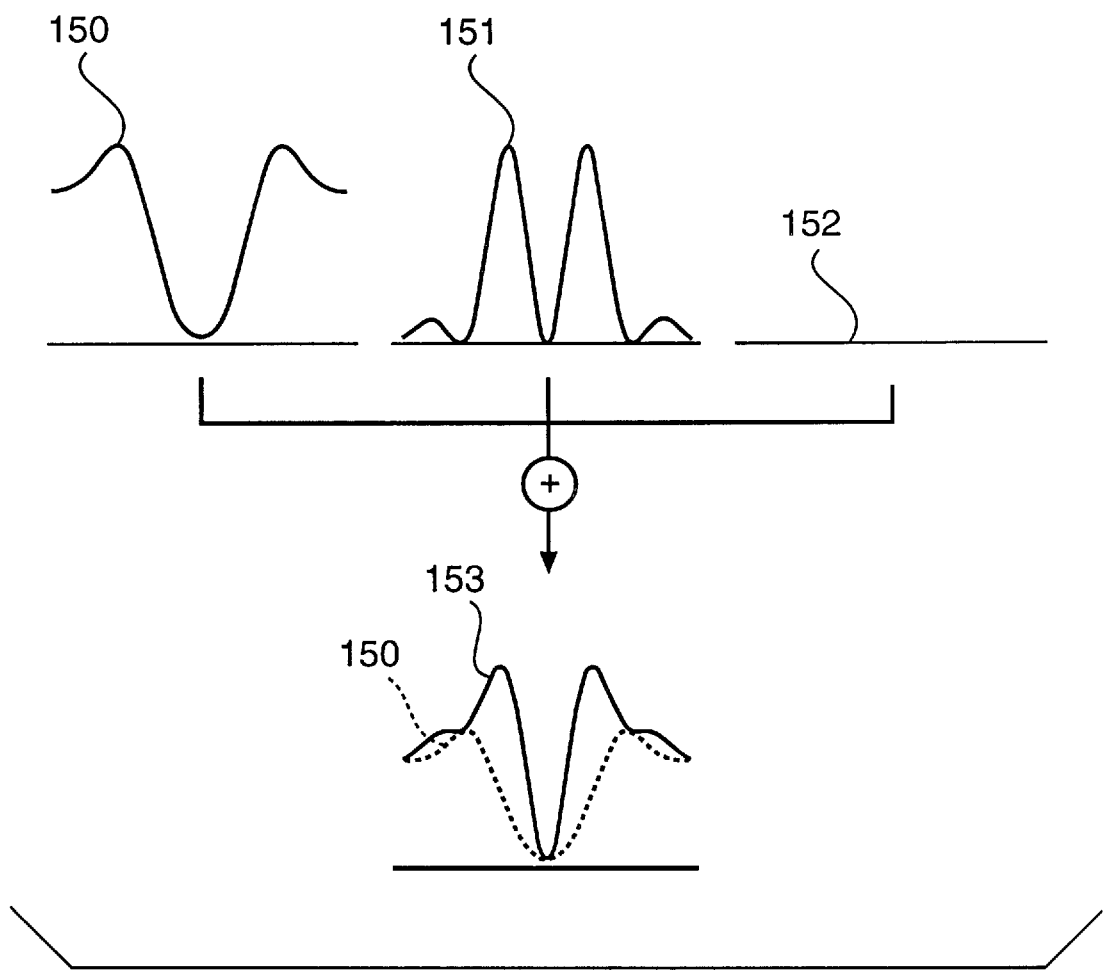
FIG. 15 is an illustration showing the concept of exposure superposition using different pupil filters.

By summing images obtained by using pupil functions A, C, and D, it is possible not only to moderate the optical proximity effect but also to greatly improve the resolution of a dark line on a bright background. For example, when considering a light intensity profile perpendicular to the direction of a dark line pattern, the light intensity distribution obtained by pupil function A is shown by curve 150 in FIG. 15 and a dark region wider than the pattern width is obtained. However, the distribution obtained by pupil function C consists of bright lines at the edges of the original line as shown by curve 151 in FIG. 15. In this case, distribution 152 obtained by pupil function D does not contribute. Therefore, a more faithful light intensity distribution 153 is obtained by superposing light intensity distributions 150, 151, and 152 onto each other.

In this case, to obtain the minimum line width, it is preferable to make the exposure values when using pupil functions C and D larger than the exposure value when using pupil function A. However, because this method causes a larger side lobe, it is preferable to increase the interval between dark patterns to a distance for which no interference is produced between adjacent patterns. Many patterns for logic LSI satisfy this criterion.

A method for realizing multiple exposure in which pupil functions are different from each other will now be described below. The most direct method for performing the multiple exposure involves preparing a plurality of pupil filters with pupil functions different from each other and changing the pupil filters for each exposure. This method makes it possible to achieve an effect equivalent to multiple exposure without changing different pupil filters as described below.

Figure 1:
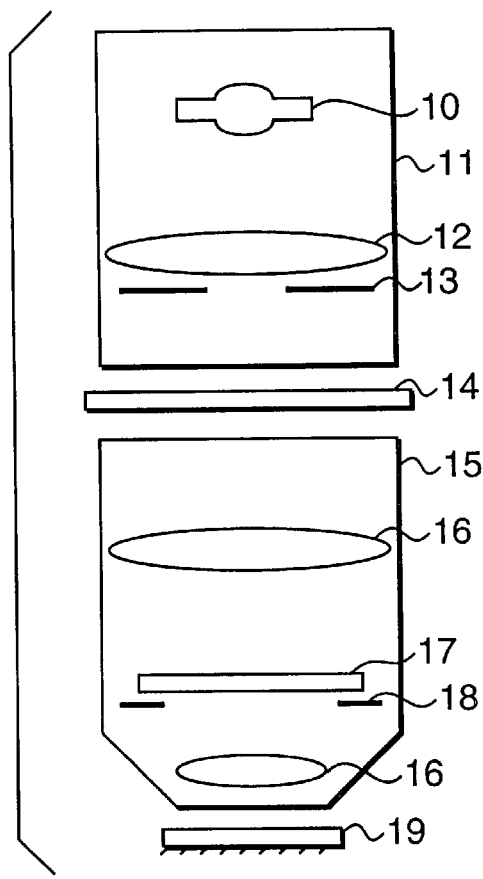
FIG. 1 is an illustration showing the basic structure of a projection exposure system.
Figure 6A:
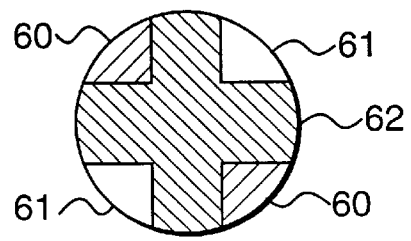
FIGS. 6(a) and 6(b) are illustrations showing pupil function of the present invention.

That is, the multiple exposure performed by using pupil functions $A_A$ and $\alpha A_B$ different from each other is equivalent to the multiple exposure using pupil function $A_1=(A_A+\alpha A_B)/\sqrt{2}$ and pupil function $A_2=(A_A-\alpha A_B)/\sqrt{2}$. FIG. 6(a) shows an example of pupil function $A_1$, in which symbol 60 denotes an area with a transmittance of 1, 61 denotes an opaque area, and 62 denotes a cross-shaped area with a transmittance of 0.5. The above a is a value showing the relative weights of the two types of exposure.

When pupil functions $A_A$ and $A_B$ have the same symmetry as pupil functions A and B shown in FIG. 2, pupil function $A_1$ and pupil function $A_2$ become the same pupil function by rotating them through 90°. Therefore, only by rotating a single-pupil filter during exposure, it is possible to obtain the same effect as double exposure using two pupil functions A and B.

When pupil function A has a completely clear pupil (transmittance is 1 for the whole surface) and pupil function B has only transmittance values of −1, 0, and 1, pupil functions $A_1$ and $A_2$ have only transmittances of 0, 0.5, and 1 for α=1. Moreover, in the central area with a transmittance of 0.5, $A_1$ and $A_2$ are common.

When rotating a pupil filter, the same problem as that when replacing pupil filters occurs. However, as described later, the same effect as that when rotating the whole pupil function is obtained by rotating only a stencil mask combined with a pupil filter instead of rotating the whole pupil filter. In this case, the above problem due to replacement or rotation of pupil filters will not occur. The above stencil mask can be rotated or secured on a filter.

The exposure using three types of pupil functions $A_A$, $αA_C$, and $αA_D$ is equivalent to the multiple exposure using pupil functions $A_1=(A_A+αA_C+αA_D)/2$, $A_2=(A_A+αA_C-aA_D)/2$, $A_3=(A_A-αA_C+αA_D)/2$, and $A_4=(A_A-αA_C+αA_D)/2$.

When pupil functions $A_A$, $A_C$, and $A_D$ have the same symmetry as pupil functions A, C, and D shown in FIG. 2 and $A_D$ is a function obtained by rotating $A_C$ through 90°, pupil functions $A_1$ to $A_4$ are obtained in order by rotating the same pupil filter incrementally through 90°. Therefore, by rotating a single pupil filter during exposure, the result same as that of the triple exposure using three types of pupil functions A, C, and D is obtained.

Figure 6B:
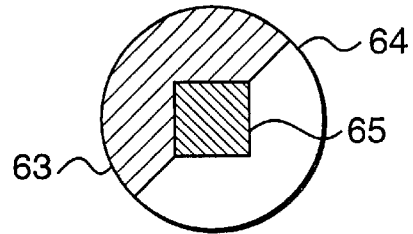

Pupil function $A_1$ shown in FIG. 6(b) comprises area 63 with a transmittance of 1, opaque area 64, and a square area 65 with a transmittance of 0.5. When pupil function A is a clear area (transmittance is 1 for the whole surface) and pupil functions C and D have only transmittances of −1, 0, and 1, transmittances of pupil functions $A_1$ to $A_4$ are only 0, 0.5, and 1 for α=1. In the case of a pupil filter having pupil functions $A_1$ to $A_4$, however, areas with a transmittance of 0.5 are all common.

In both pupil functions shown in FIG. 6 the area occupied by the image of the effective source in the pupil plane is attenuated. Such pupils have the property of decreasing the intensity of the undiffracted light relative to the various diffraction orders, and are sometimes referred to as conjugate filters.

We also observe that in FIG. 6b a relatively large fraction of the pupil area is opaque and therefore unused. This suggests shifting the pupil filter sideways towards the opaque side of the pupil, thereby effectively enlarging the pupil radius on the clear side of the pupil. This increase in the pupil radius should lead to improved contrast for high spatial frequencies. However, in order to maintain the condition for a conjugate filter, the effective source has to be shifted off-axis by a corresponding distance. It may thus be useful to combine the multiple pupil exposure scheme with off-axis illumination. However, to perform multiple exposures with rotated versions of the pupil function, the effective source then has to be rotated as well. Combining multiple pupil exposure with off-axis illumination therefore requires a variable illuminator to change the effective source distribution between subsequent exposures of the same mask pattern.

Various embodiments of the present invention will now be described in detail. It should be understood that the present invention is not limited to only these embodiments, but includes various modification obvious to one of ordinary skill in the art.

Embodiment 1

Figure 7A:
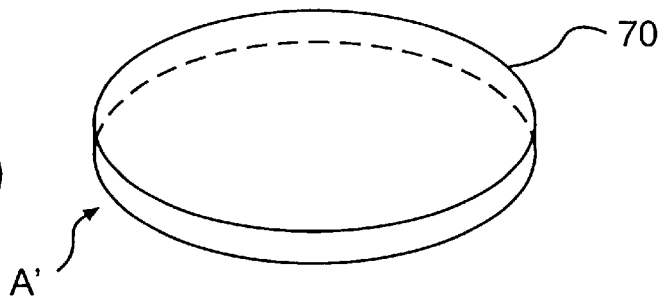
FIGS. 7(a) to 7(c) are illustrations showing the structure of pupil filters for realizing a pupil function of the present invention.
Figure 7B:
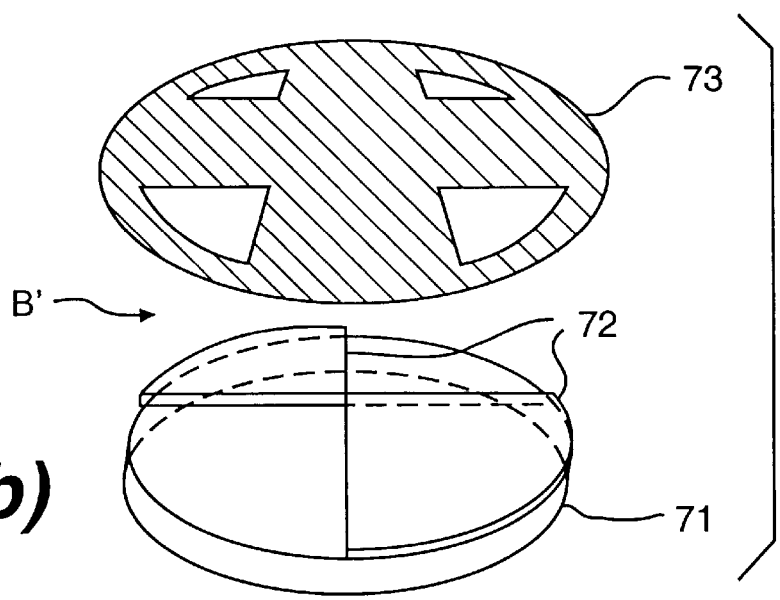

This embodiment shows a case of performing double exposure by using pupil functions A and B shown in FIGS. 2(a) and 2(b). First, as shown in FIGS. 7(a) and 7(b), two pupil filters A' and B' to be set to the pupil position of a projection lens are prepared. Because pupil filter A' shown in FIG. 7(a) comprises only transparent substrate 70, the conventional circular opening, that is, the performance of pupil function A, of FIG. 2(a), is achieved for the projection lens.

Pupil filter B' shown in FIG. 7(b) is provided with phase retarding layer 72 deposited on transparent substrate 71 and moreover, provided with opaque stencil 73 above the film 72. However, in FIG. 7(b), it should be understood that for the sake of clarity, the spacing between transparent substrate 71 and stencil 73 is exaggerated and shown to be large.

Phase retarding layer 72 delays the phase of the light passing through it up to 180° from that of the light passing through a portion where phase retarding layer 72 is not present and its thickness is set to $0.5λ/(n-1)$, where "n" denotes the refractive index of phase retarding layer 72. In this embodiment, the value of "n" is 1.47 because an $SiO_2$ evaporated film is used. A mask pattern was transferred by setting pupil filters A' and B' to the pupil position of the projection lens of a stepper.

Figure 9:
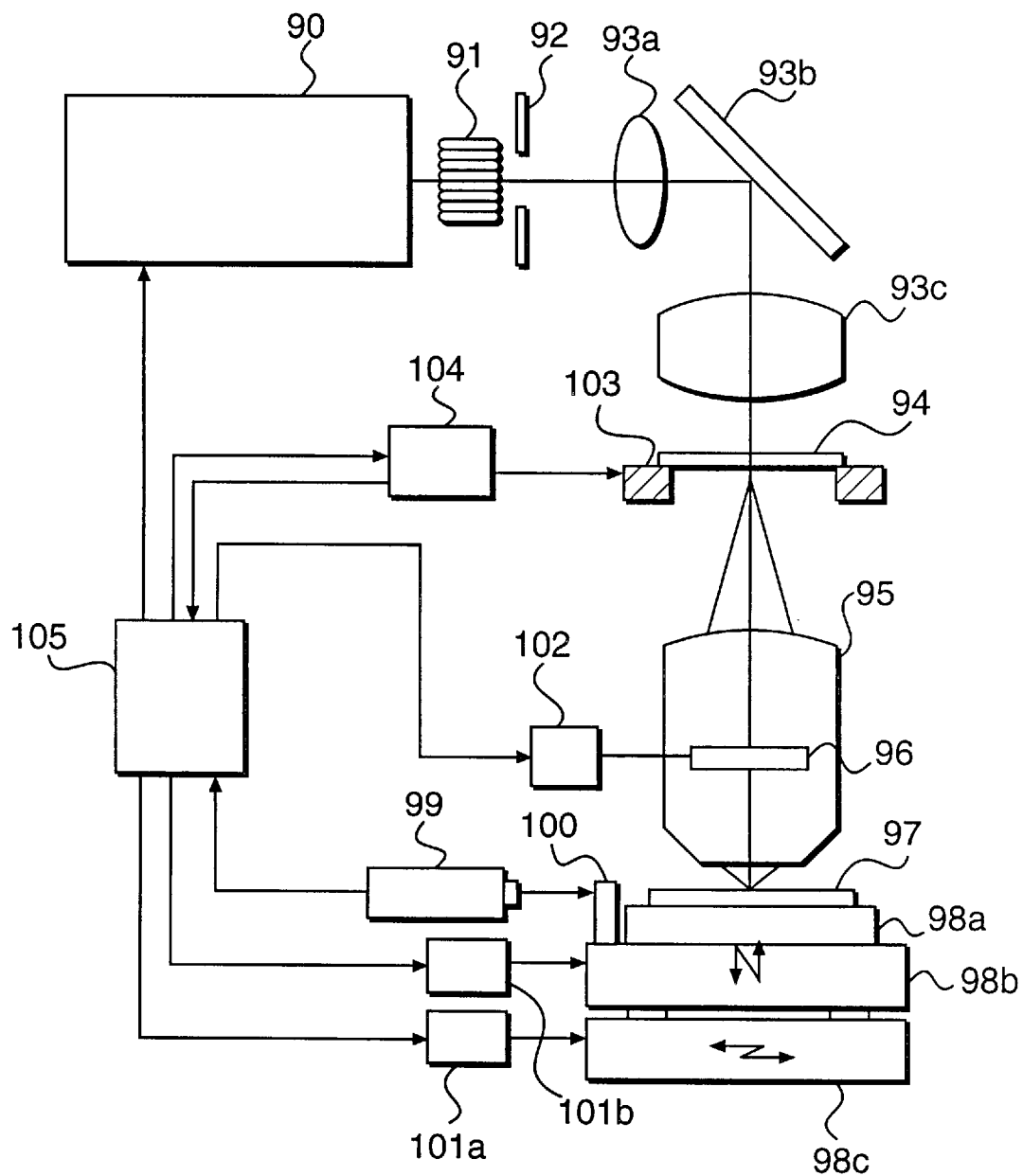
FIG. 9 is an illustration showing the structure of a stepper used for the present invention.

FIG. 9 shows the stepper used for this embodiment. The light emitted from source 90 illuminates mask 94 through a fly-eye lens 91, a circular aperture 92 for specifying the coherency of illumination, and a group of condensers 93a, 93b, and 93c. The pattern drawn on mask 94 is projected onto wafer 97 through projection lens 95. Mask 94 is mounted on mask stage 103 controlled by mask position control means 104 and the center of mask 94 is accurately aligned with the optical axis of projection lens 95. Wafer 97 coated with photoresist is held by a vacuum onto wafer stage 98a.

Wafer stage 98a is mounted on Z stage 98b movable in the direction of the optical axis of projection lens 95, that is, in the Z direction and moreover mounted on XY stage 98c movable in the X and Y directions. Because Z stage 98b and XY stage 98c are driven by driving means 101a and 101b respectively in accordance with a control instruction sent from main control system 105, they can be moved to a desired exposure position. The position is accurately monitored by laser interferometer 99 as the position of mirror 100 secured to Z stage 98b. The surface position of wafer 97 is measured by focus monitoring means of a normal exposure system and is always adjusted to the imaging plane of projection lens 95 by driving Z stage 98b in accordance with a measurement result.

Various pupil filters 96 are selected, set to, changed at, or rotated at the pupil position of projection lens 95 by pupil filter driving means 102. The pupil position is the position where the pupil filter is desirably positioned for exposure.

Figure 10:
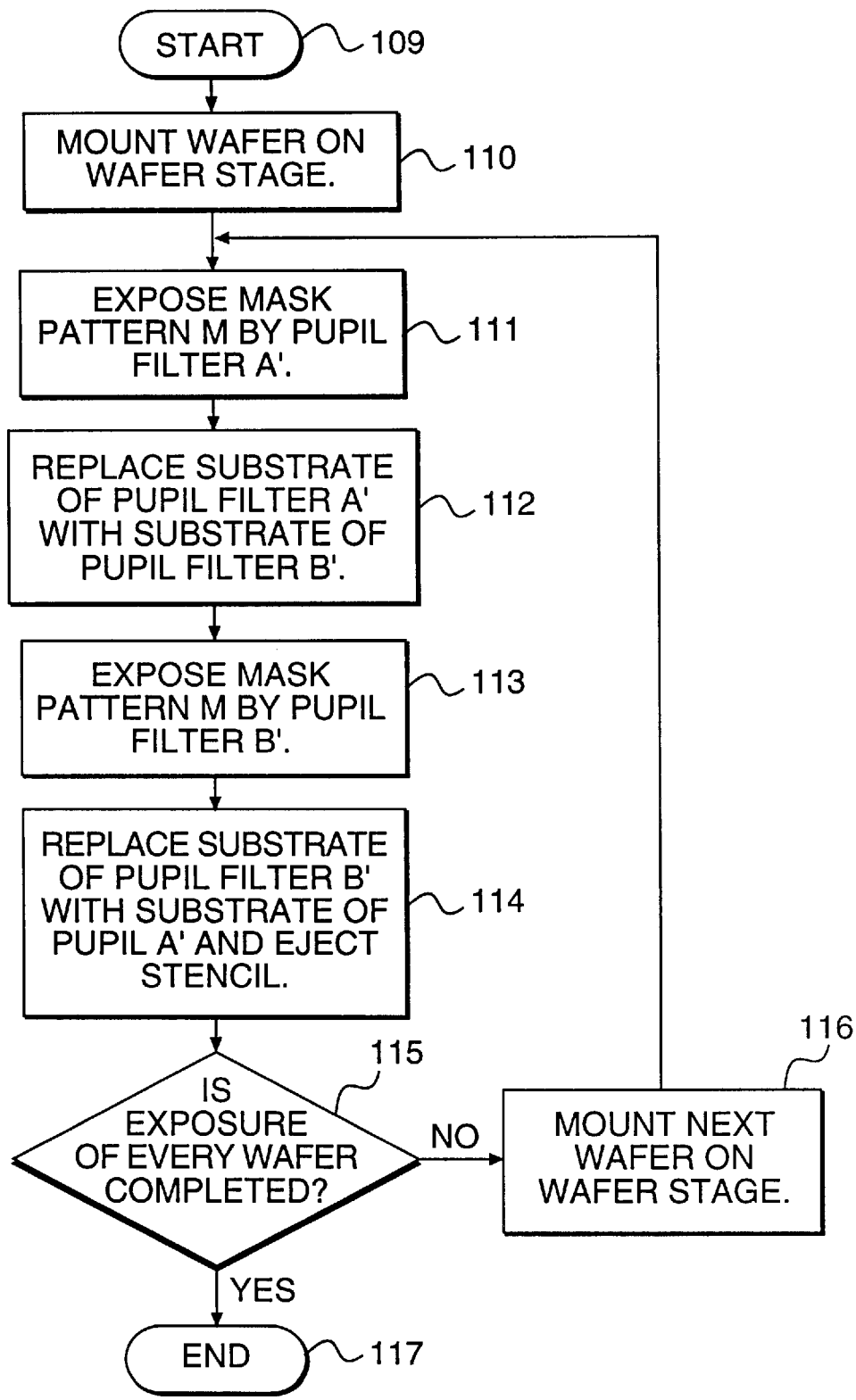
FIG. 10 is a chart showing the flow of an exposure process of the present invention.

FIG. 10 shows a flow of exposure starting with step 109. Predetermined mask M having a square fine hole pattern is mounted on a projection exposure system, then a wafer coated with positive-tone photoresist is mounted on a wafer stage in step 110, and thereafter the pattern of mask M is transferred by using pupil filter A' in first exposure step 111.

Then, pupil filter A' is replaced for pupil filter B' in pupil-filter change step 112 and moreover, stencil 73 is inserted. Thereafter, the pattern of mask M is transferred by pupil filter B' in second exposure step 113.

Next, pupil filter B' is changed to pupil filter A' again in pupil-filer change step 114 to eject stencil 73. At step 115, it is determined whether exposure of every wafer has been completed. If not, the wafer stage is moved in wafer transfer step 116 to mount the next wafer. This procedure is repeated until exposure of every wafer is completed and the flow ends (Step 117).

Multiple exposure is performed according to this flow by changing pupil functions in order to develop a fine hole pattern, and then, the formed fine hole pattern is observed using a scanning electron microscope. As a result of transferring a square hole pattern with a side length of 0.4 µm by an in-line stepper, an approximately square resist pattern free from shape deterioration is formed as shown in FIG. 14(*a*). For the sake of comparison, if the process was performed by using only pupil filter A' for comparison, the resist pattern would be circular as shown in FIG. 14(*b*), although the mask pattern is square.

In this embodiment, wafers are exposed by changing pupil filters for each wafer. However, it is also possible to expose every prepared wafer by pupil filer A' and thereafter, expose every wafer by changing pupil filter A' to pupil filter B'. The projection exposure system according to the present invention is not restricted to the system used in the embodiment above. The same effect is obtained by using a projection exposure system having a source for emitting light with different wavelengths or a projection exposure system for performing exposure while scanning a mask and a wafer.

The method shown in this embodiment can be applied to every embodiment shown below. Moreover, in particular, when transferring an isolated opening pattern formed in an opaque portion, the resolution is improved even if stencil 73 is removed from pupil filer B'.

Embodiment 2

In this embodiment, a pattern is transferred by using a polarization filter separately from replacement of pupil filters requiring alignment. The light emitted from a source is changed to polarized light and a polarization filter that is used has a uniform transmittance for one-side polarization and produces phase shifts same as those of phase retarding layer 72 shown in FIG. 7(*b*) for the other-side polarization. The polarization filter includes a birefringent substrate and a phase retarding layer patterned on the substrate. The phase retarding layer can be formed by depositing a material serving as the phase retarding layer on the entire surface of the substrate and thereafter performing either the steps of resist coating, patterning, and etching in order or the steps of resist coating, patterning, depositing of a material serving as the phase retarding layer, and lifting-off in order.

The pupil filter is set to the pupil position of the projection lens of a projection exposure system to perform exposure as set forth below.

First, mask M, similar to that of embodiment 1, is exposed by illumination polarized in one direction. Then, the polarized illumination light is rotated up to 90° and thereafter, a stencil is inserted by pupil filter driving means 102, and the same mask pattern is exposed to the same position on a wafer. Finally, the polarized illumination light is rotated up to −90° to eject the stencil. Thereafter, the above procedure is repeated until exposure of every wafer is completed.

As described above, the above multiple exposure procedure is applied onto wafer 97 coated with photoresist by a projection exposure system having a source for emitting polarized light to develop the wafer and thereafter, a fine hole pattern that is formed is observed by a scanning electron microscope. As a result, it can be confirmed that the effect same as that of embodiment 1 is obtained.

Embodiment 3

Figure 7C:
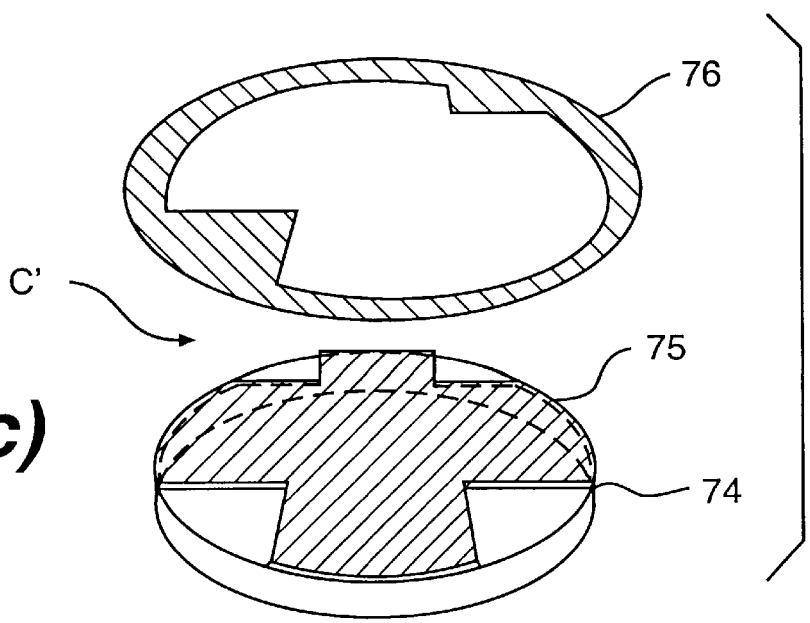

In the case of this embodiment, exposure is performed by using pupil filter C' schematically shown in FIG. 7(*c*) as a pupil filter having the pupil function $A_1$, shown in FIG. 6(*a*). Pupil filter C' comprises transparent substrate 74 on which film 75 having an amplitude transmittance of 0.5 is formed like a cross and stencil 76 serving as an opaque portion and the pupil function corresponds to the pupil function shown in FIG. 6(*a*). The spacing between filter substrate 74 and stencil 76 is illustrated in an exaggerated manner.

This embodiment is constituted so that transparent substrate 74 is secured and only stencil 76 can be rotated. The pupil filter is set to the pupil position of a projection lens to perform exposure in accordance with the following flow.

First, stencil 76 is arranged at a first position to expose mask M by pupil filter $C'_1$ (pupil function $A_1$). Then, only stencil 76 is rotated up to 90° by pupil driving means 102. Thereafter, the same mask pattern is exposed to the same position on a wafer. Finally, stencil 76 is rotated up to −90° to return it to the first position. Thereafter, the above procedure is repeated until exposure of every wafer is completed. The multiple exposure is applied onto wafer 79 coated with photoresist to observe a developed resist pattern by a scanning electron microscope. As a result, it is confirmed that the effect is the same as that obtained according to embodiment 1.

Embodiment 4

This embodiment shows a case of performing multiple exposure by a mask in which isolated bright dots are formed on a dark background and makes it possible to omit a cross-shaped area 75 in which the pupil filter used for embodiment 3 has a transmittance of 0.5.

That is, transparent substrate 74 or cross-shaped area 75 is not used but only stencil 76 is used. As shown in FIG. 7(*c*), stencil 76 contains most of the opaque area in two opposite quadrants of the pupil. A filter comprising stencil 76 is set to the pupil position of a projection exposure system to perform exposure in accordance with the following flow.

First, stencil 76 is arranged to a first position (pupil function $A_1$) to expose mask M on which isolated bright dots are formed. Then, stencil 76 is rotated up to 90° by pupil filter driving means 102. Then, the same mask pattern is exposed onto the same position of a wafer. Finally, stencil 76 is rotated up to −90° to return it to the first position. Thereafter, the above-mentioned procedure is repeated until exposure of every wafer is completed. As the result of applying the above multiple exposure onto wafer 97 coated with photoresist and developing it, it is confirmed through observation by a scanning electron microscope that an effect the same as that of embodiment 1 is obtained.

Embodiment 5

Figure 8A:
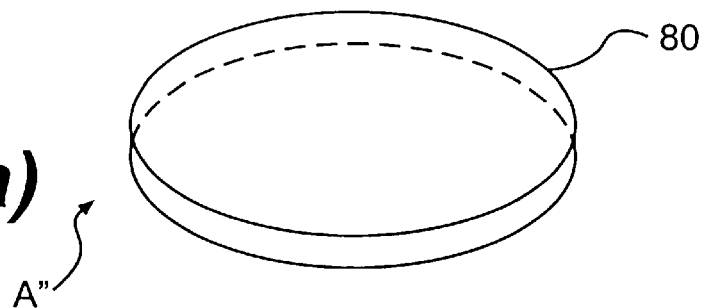
FIGS. 8(a) to 8(c) are illustrations showing the structure of pupil filters for realizing another pupil function of the present invention.
Figure 8B:
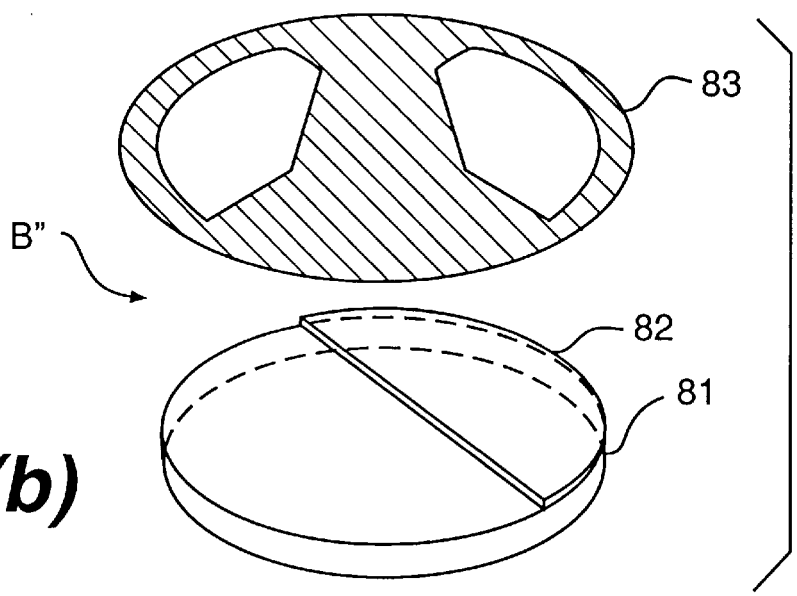

In this embodiment, triple exposure according to pupil functions A, C, and D shown in FIG. 2 is performed by the pupil filter shown in FIG. 8. To easily perform the triple exposure, different filters A" and B" are used by combining them. Pupil filter A", includes only transparent substrate 80 as shown in FIG. 8(*a*), and corresponds to a case of pupil function A of entire surface transmission (FIG. 7(*a*)). Because pupil functions C and D shown in FIG. 2 are obtained by rotating the same shape up to 90° from each other, they are realized by rotatable pupil filter B". Pupil filter B", as shown in FIG. 8(*b*), comprises transparent substrate 81, phase retarding layer 82, and opaque stencil 83. These pupil filters A" and B" are set to the pupil position of the projection lens of a projection exposure system to perform exposure in accordance with the following flow.

First, mask M having a pattern that is longer in one direction is exposed by transparent filter A". Then, pupil filter A" is replaced with pupil filter B" (corresponding to pupil functions C and D) by pupil filter driving means 102, and stencil 83 is inserted to expose the same mask pattern at the same position on a wafer (pupil function C).

Stencil 83 is rotated up to 90° to expose the same mask pattern at the same position on the wafer (pupil function D). Finally, pupil filter A" is returned to the substrate to eject stencil 83. Thereafter, the above procedure is repeated until exposure of every wafer is completed. As a result of performing multiple exposure onto wafer 97 coated with photoresist and developing it, a resist pattern faithful to the mask pattern shape can be formed. Moreover, in order to expose patterns consisting of only horizontal lines, it is enough to perform only the exposure in accordance with pupil functions A and C and the exposure in accordance with pupil function D can be omitted. Moreover, when exposing patterns consisting of only vertical lines, the same effect is obtained even by omitting the exposure in accordance with pupil function C.

Embodiment 6

In the case of this embodiment, multiple exposure is performed by using polarized light and changing pupil functions. This embodiment uses a polarized light source and a pupil filter which passes one-directional polarized light at a predetermined transmittance and produces a phase difference for other-directional polarized light like phase retarding layer 82 shown in FIG. 8(b). The pupil filter is formed by the method disclosed in embodiment 2. The pupil filter is set to the pupil position of the projection lens of a projection exposure system having a polarized light source to perform exposure in accordance with the following flow.

First, mask M, similar to that of embodiment 5, is exposed by one-directional polarized light (pupil function A). Then, the direction of the polarized light is rotated up to 90° and a stencil is inserted to expose the same mask pattern at the same position on a wafer (pupil function C).

The stencil is rotated up to 90° to expose the same mask pattern at the same position on the wafer (pupil function D). Finally, the polarized light is rotated up to −90° to eject the stencil. Thereafter, the above procedure is repeated until exposure of every wafer is completed. As the result of applying multiple exposure to wafer 97 coated with photoresist and developing it, a resist pattern faithful to the shape of the mask pattern can be formed.

Embodiment 7

Figure 8C:
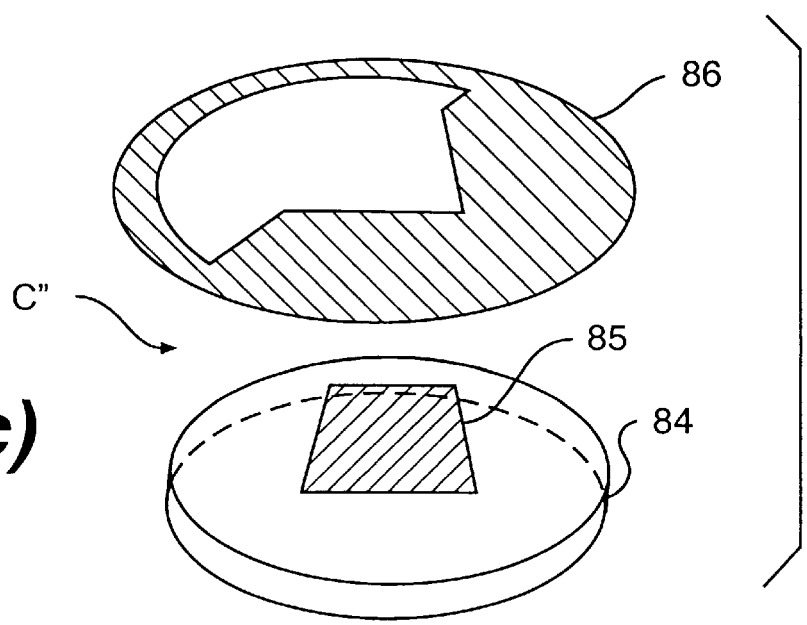

In the case of this embodiment, pupil functions A, C and D are realized in order by rotating a single pupil filter incrementally through 90° during exposure to transfer a pattern. Pupil function C" shown in FIG. 8(c) is a pupil filter corresponding to the pupil function in FIG. 6(b), including a transparent substrate 84 on which film 85 with a transmittance of 0.5 is locally formed and an opaque stencil 86. Pupil function C" is set to the pupil position of the projection lens of a projection exposure system to perform exposure in accordance with the following flow.

First, substrate 84 and stencil 86 are arranged at predetermined positions to expose mask M similarly to the case of embodiment 5 (pupil function $A_1$). Then, stencil 86 is rotated up to 90° to expose the same mask pattern at the same position on a wafer (pupil function $A_2$).

Then, stencil 86 is rotated up to 90° to expose the same mask pattern at the same position on the wafer (pupil function $A_3$). Then, stencil 86 is rotated up to 90° to expose the same mask pattern at the same position on the wafer (pupil function $A_4$). Finally, stencil 86 is rotated up to 90° to return it to the original position. Thereafter, the above procedure is repeated until exposure of every wafer is completed. As the result of applying the multiple exposure to wafer 97 coated with photoresist and developing it, a resist pattern faithful to the shape of the mask pattern can be formed.

Embodiment 8

Figure 11A:
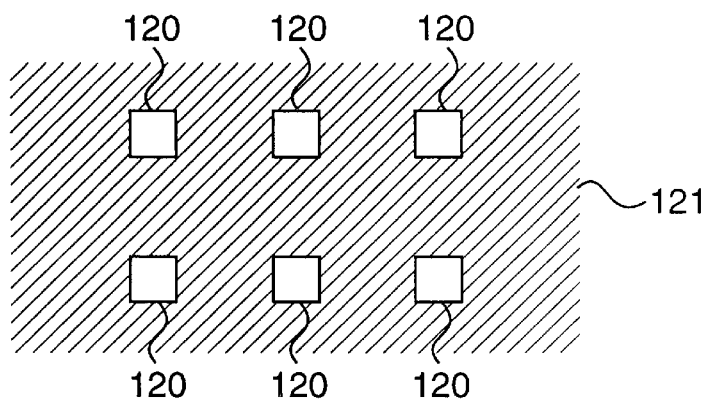
FIGS. 11(a) and 11(b) are illustrations showing mask patterns.
Figure 11B:
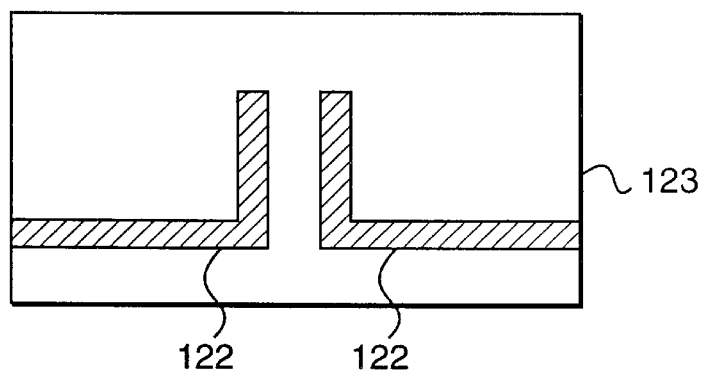

The double exposure set forth above in embodiments 1 through 4 is particularly suitable for the transfer of isolated bright patterns 120 on a dark background 121, as shown in FIG. 11(a). Moreover, the multiple exposure shown in the above embodiments 5 to 7 is particularly suitable for the transfer of fine dark line patterns 122 on a bright background 123 shown in FIG. 11(b).

This embodiment shows a case of applying the present invention to the fabrication of a semiconductor integrated circuit device, which is described below by referring to FIGS. 12(a)–12(e). FIGS. 12(a)–12(e) illustrate a part of the fabrication process of a semiconductor integrated circuit device.

Figure 12A:
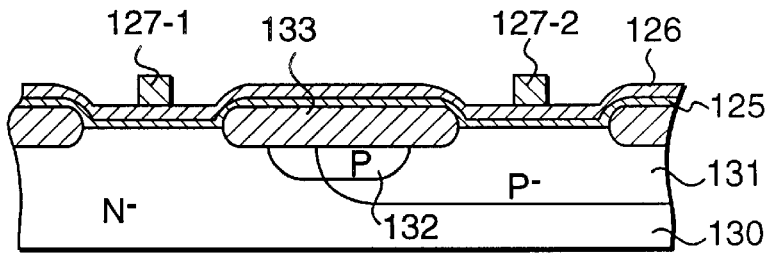
FIGS. 12(a) to 12(e) are process diagrams showing a case of applying the present invention to the fabrication of a semiconductor integrated circuit device.

First, as shown in FIG. 12(a), P-type well 131, P-type layer 132, and field oxide film 133 are formed on N-type silicon substrate 130 by a generally known method and moreover, silicon oxide film 125 and polycrystalline silicon film 126 are formed on them. Furthermore, coating with photoresist and exposure and development using a mask for forming gate pattern 145 shown in FIG. 13(a) are performed in order to form resist patterns 127-1 and 127-2. The above exposure is performed by changing pupil filters in accordance with the method disclosed in embodiments 5, 6, or 7, above.

Figure 12B:
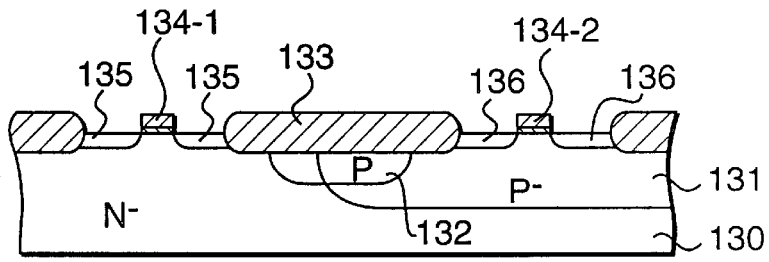

Exposed portions of polycrystalline silicon film 126 and silicon oxide film 125 are dry-etched in order, by using resist patterns 127-1 and 127-2 as masks, to form composite films 134-1 and 134-2 comprising a polycrystalline silicon film and a silicon oxide film and thereafter resist patterns 127-1 and 127-2 are removed. Then, a generally-known ion implantation technique is performed to form a P-type high-concentration impurity layer 135 and an N-type high-concentration impurity layer 136 as shown in FIG. 12(b).

Figure 12C:
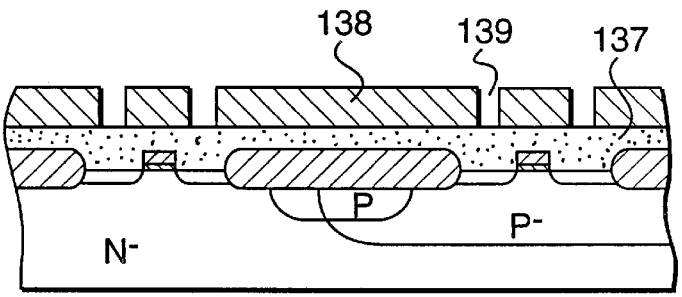
Figure 12D:
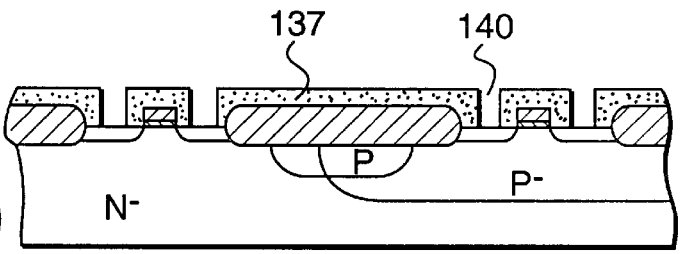

A phospho-silicate glass (PSG) film 137 is formed on the entire surface by a generally-known method and photoresist film 138 is formed on film 137 by a generally-known coating method and thereafter, exposure is performed by changing pupil filters as shown in the above embodiments 5, 8, and 7 to form hole pattern 139 shown in FIG. 12(c). Then, as shown in FIG. 12(d), the exposed portion of phospho-silicate glass film 137 is dry-etched by using photoresist film 138 as a mask to form contact hole 140.

Figure 12E:
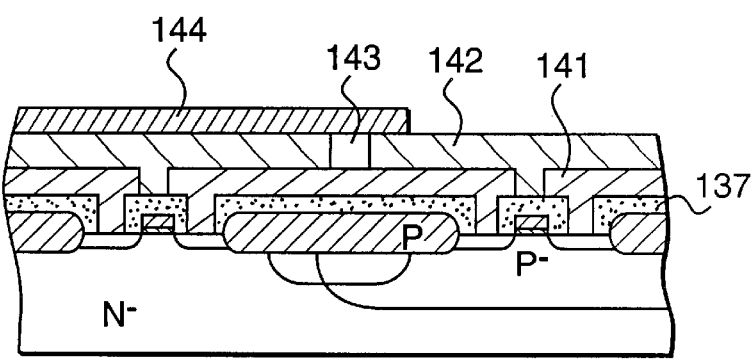

Interconnection 141 and inter-level insulation layer 142 which are made of a laminated film, of a W film and a TiN film, respectively, are formed by a generally-known method. Then, a photoresist mask (not illustrated) is formed by a generally-known method and the exposure using the method shown in embodiment 1 and normal etching are performed to form hole pattern 143 as shown in FIG. 12(e). A W-plug is embedded in hole pattern 143 to connect second wiring 144 made of an Al film. Subsequent processes are executed according to conventionally known methods.

FIG. 13(b) shows a layout of contact hole pattern 146 for connecting interconnections M1 and M2.

Though only main fabrication processes are shown in this embodiment, the same processes as those according to conventional methods are used, except that the exposure method of the present invention is used for the transfer of gate patterns and contact hole patterns. As a result, it is possible to prevent imperfect resolution of gate and contact-hole patterns and fabricate semiconductor integrated circuit devices with a high yield.

Embodiment 9

According to this embodiment, the different pupil functions are realized using a single filter, which is translated (shifted laterally) perpendicular to the optical axis between the partial exposures of the same pattern at the same wafer substrate location. The diameter of the pupil filter is at least equal to 1.5 times the diameter of the clear aperture of the projection system. The areas of the pupil function containing a phase shift of 180° are realized using a transparent phase retarding layer covering the corresponding parts of the pupil filter. The areas of the pupil function containing zero amplitude transmittance are realized using an opaque stencil, which can be rotated and replaced in between the partial exposures.

Figure 16A:
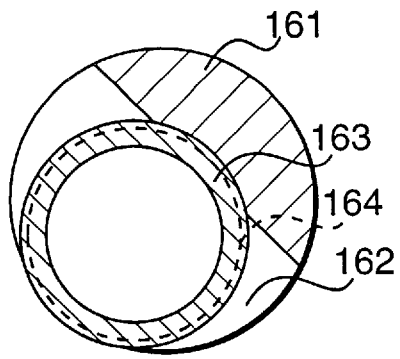
FIGS. 16(a) to 16(c) illustrate the implementation of pupil functions A, C and D of FIG. 2.
Figure 16B:
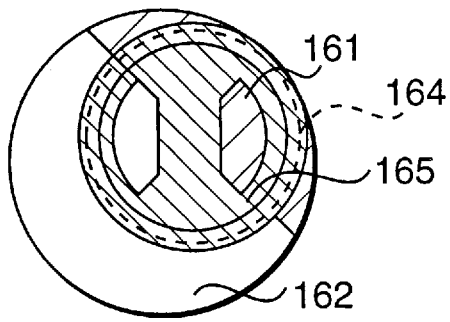
Figure 16C:
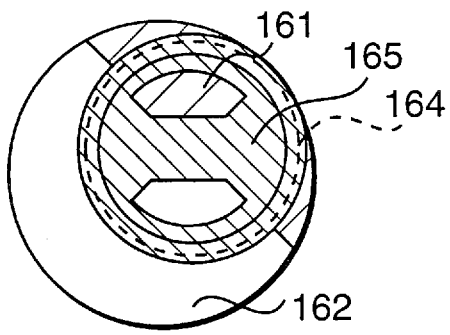

For example, in FIG. 16 illustrates an implementation of the pupil functions A, D and C shown in FIGS. 2(a), 2(d) and 2(c), respectively. A phase retarding layer 161 covers approximately one third of the transparent substrate 162 of the pupil filter. To realize pupil function A, the part of substrate 162 containing no phase retarding layer is aligned with a clear aperture 164, shown by a dotted circle, of the projection system. An annular stencil 163 selects the desired numerical aperture (FIG. 16(a)).

Next, to achieve pupil function B, stencil 163 is replaced by stencil 165, which has two openings of the appropriate shape. The substrate 162 is shifted such that light transmitted through the two openings has opposite phase (FIG. 16(b)). Finally, to achieve pupil function C, stencil 165 is rotated by 90° (FIG. 16(c)). To return from pupil function C to pupil function A, stencil 165 is replaced by stencil 163, and substrate 162 is shifted back to its original position.

Embodiment 10

This embodiment illustrates an example of a mask layout design for actual device patterns. In the following discussion, we use the scale on the wafer plane for simplicity. All the scales should be multiplied by the factor of magnification when we discuss the sizes on the mask.

Figure 17A:
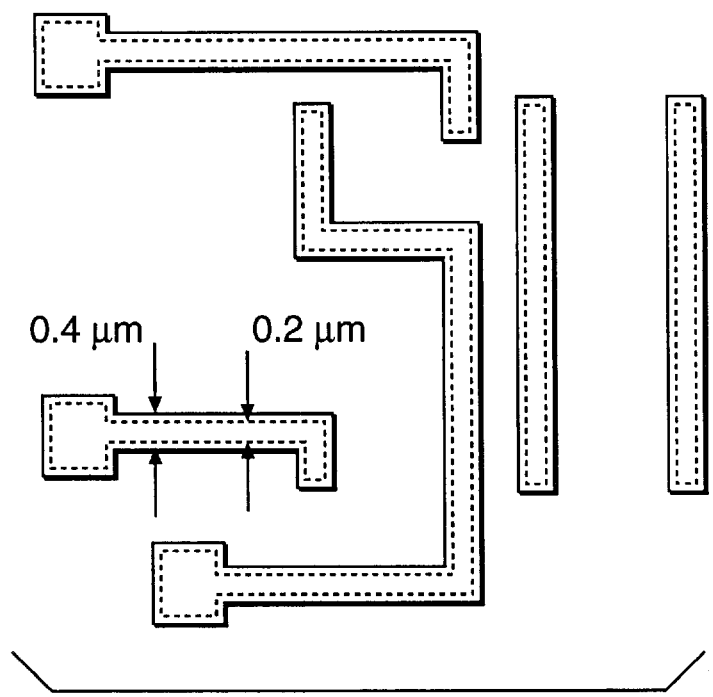
FIGS. 17(a) to 17(d) illustrate various mask pattern layouts according to the present invention.

FIG. 17(a) illustrates an example of the gate patterns designed with a 0.4 $\mu$m design rule, which means the minimum feature we can delineate is 0.4 $\mu$m line and 0.4 $\mu$m spaces. (All mask patterns discussed in this section are assumed to be bright field masks, that is each wiring corresponds to an opaque region). As in usual gate patterns in MOS logic circuits, the separations between gate patterns is in most cases about two to three times larger than the gate pattern width itself.

By exposing the mask shown in FIG. 17(a) using the present method described in other portions of this specification, it is possible to obtain the resist pattern as shown by the dotted line in FIG. 17(a) because it can reduce the gate width by about half. However, there is too much area between the gate patterns, which results in a waste of space. Thus, it is useful to redesign the mask to obtain the final resist patterns as if it is designed with 0.2 $\mu$m design rule. The most effective results are obtained by modifying the mask so that the resulting minimum separation between neighboring gate patterns becomes about three times larger than the minimum gate width attainable with the present method.

To achieve this purpose, the pattern shown in FIG. 17(a) is converted according to the following procedure.

Figure 17B:
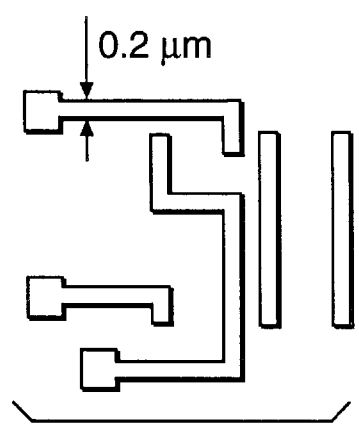

(1) Entire patterns are reduced in size by about 50%. This provides the same circuit patterns but designed with a 0.2 $\mu$m design rule (FIG. 17(b)).

Figure 17C:
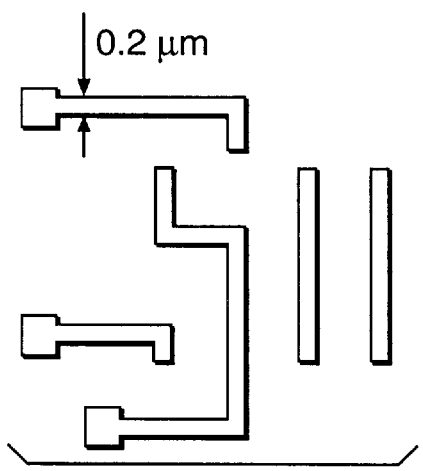

(2) If any distances between electrically separated (independent) patterns are smaller than 0.6 $\mu$m (three times the minimum gate width) or are less than 0.75·$\lambda$/NA, where $\lambda$ represents a wavelength of light used for exposure and NA represents a numerical aperture of projection optics, the position of some patterns are shifted so that they become larger than 0.6 $\mu$m or greater than 0.75·$\lambda$/NA (FIG. 17(c)).

(3) Pattern widths are broadened for every pattern in all directions by about 0.1 $\mu$m (half the minimum gate width) or 0.125·$\lambda$/NA.

Figure 17D:
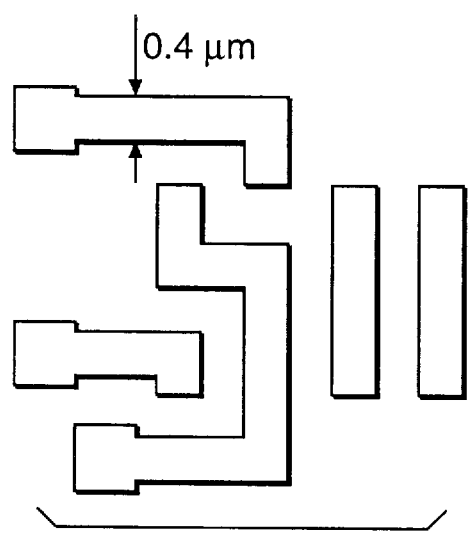

FIG. 17(d) illustrates the mask pattern obtained by converting the original mask shown in FIG. 17(a) with the above mentioned procedure. By exposing the mask shown in FIG. 17(d), it is possible to obtain the resist pattern just as shown in FIG. 17(c). In FIG. 17(c), the entire circuit area was reduced to about 30% of that in FIG. 17(a). By combining the mask prepared by the above procedure with the exposure method described in the present invention, the overall area of integrated circuits can be reduced drastically.

It should be noted that positions for some of the patterns may be changed from the restriction in pattern layout on the other layers of the circuit, in addition to the requirement for pattern position as described in item (2) of the mask conversion procedure described above. Furthermore, other alterations can be made to this embodiment as long as they are reasonable in context with the present invention.

The present invention makes it possible to improve the fidelity of the shape of a pattern transferred image without increasing the numerical aperture (NA) of a projection lens, decreasing the wavelength of the light used for exposure, or locally deforming the mask pattern. The present invention is easy to implement in practice because it is only necessary to change the pupil functions during exposure. Particularly, for patterns consisting of vertical and horizontal edges which are common to most semiconductor devices, it is possible to prevent deterioration of an image such as line-end shortening and corner rounding. Moreover, it is possible to improve the imaging performance for narrow dark line patterns. Therefore, particularly in the case of gate patterns and contact hole patterns requiring a high resolution and a shape accuracy, it is possible to improve resolution, and fabricate semiconductor integrated circuit devices with high yield.

While the present invention has been described above in connection with disclosed preferred embodiments, one of ordinary skill in the art would be enabled by this disclosure to make various modifications to these embodiments and still be within the scope and spirit of the present invention as recited in the appended claims.

What is claimed is:

1. A pattern forming method of projecting a pattern on a mask, having a top surface, onto a substrate through a projection lens in order to transfer the pattern onto the substrate, comprising the steps of:

illuminating the pattern on the mask in a direction almost perpendicular to the top surface of the mask, with a pupil filter having a first pupil function disposed between the mask and the substrate, the pupil filter defining a pupil plane;

changing the pupil filter with a first pupil function to a pupil filter with a second pupil function; and continuing illuminating the pattern on the mask, wherein at least one of the first and second pupil functions has an amplitude transmittance distribution that is asymmetric with respect to a pupil center.

2. The pattern forming method according to claim 1, wherein the pupil functions include pupil function $A_1$ and pupil function $A_2$ satisfying the following relations:

$$A_1(X, Y) = A_1(-X, Y) = A_1(X, -Y) = A_1(-X, -Y),$$

and $$A_2(X, Y) = -A_2(-X, Y) = -A_2(X, -Y) = A_2(-X, -Y),$$

where X and Y denote orthogonal axes in the pupil plane and having an optical axis defined by the projection lens as an origin.

3. The pattern forming method according to claim 2, wherein the pupil function $A_1(X, Y)$ takes a value 1 in an entire pupil area, the pupil function $A_2(X, Y)$ takes any one of values 1, 0, and −1 in the pupil plane, and the area for which $A_2(X, Y)=0$ has approximately the shape of a cross, covering an image of an effective source in the pupil plane.

4. The pattern forming method according to claim 1, wherein the pupil functions include pupil function $B_1$ and pupil function $B_2$ satisfying the following relations:

$$B_1(X, Y) = B_1(Y, X) = B_1(-Y, -X),$$

and $$B_2(X, Y) = B_1(-Y, X),$$

where X and Y denote orthogonal axes in the pupil plane with an optical axis defined by the projection lens as an origin.

5. The pattern forming method according to claim 4, wherein the pupil function $B_1(X, Y)$ takes any one of values 1, 0.5, and 0 and an area for which $B_1(X, Y)=0.5$ covers an image of an effective source in the pupil plane.

6. The pattern forming method according to claim 5, wherein the pupil function $B_1(X, Y)$ takes a value 1 or 0 in a pupil area and an area for which $B_1(X, Y)=0$ is arranged symmetrically with respect to the pupil center.

7. The pattern forming method according to claim 1, further comprising the steps of:

changing the pupil filter with the second pupil function to a pupil filter with a third pupil function; and continuing illuminating the pattern on the mask, wherein the pupil functions include pupil functions $C_1$, $C_2$, and $C_3$ meeting the following relations:

$$C_1(X, Y) = C_1(-X, Y) = C_1(X, -Y) = C_1(-X, -Y),$$

$$C_2(X, Y) = -C_2(-X, Y) = C_2(X, -Y),$$

and $$C_3(X, Y) = C_2(-Y, X),$$

where X and Y denote orthogonal axes in the pupil plane with the optical axis as the origin.

8. The pattern forming method according to claim 7, wherein the pupil function $C_1(X, Y)$ takes a value 1 in an entire pupil area, the pupil function $C_2(X, Y)$ takes any one of values 1, 0, and −1, and an area for which $C_2(X, Y)=0$ has a shape of a stripe, which covers an image of an effective source in the pupil plane.

9. The pattern forming method according to claim 1 further comprising the steps of:

changing the pupil filter with the second pupil function with a pupil filter with a third pupil function;

continuing illuminating the pattern on the mask;

changing the pupil filter with the third pupil function with a pupil filter with a fourth pupil function; and continuing illuminating the pattern on the mask, wherein the pupil functions include pupil functions $D_1$, $D_2$, $D_3$, and $D_4$ meeting the following relations:

$$D_1(X, Y) = D_1(Y, X),$$

$$D_2(X, Y) = D_1(-Y, X),$$

$$D_3(X, Y) = D_1(-X, -Y),$$

and $$D_4(X, Y) = D_1(Y, -X),$$

where X and Y denote orthogonal axes in the pupil plane with an optical axis of the projection lens as an origin.

10. The pattern forming method according to claim 9, wherein the pupil function $D_1(X, Y)$ takes any one of values 1, 0.5, and 0 and the area for which $D_1(X, Y)=0.5$ covers an image of an effective source in the pupil plane.

11. The pattern forming method according to claim 1, wherein the pupil functions are realized using patterned opaque layers, partially absorbing layers and phase-retarding layers on a transparent substrate.

12. The pattern forming method according to claim 11, wherein the step of changing a pupil filter with a first pupil function to a pupil filter with a second pupil function involves physically replacing a first pupil filter with a second pupil filter.

13. The pattern forming method according to claim 1, wherein the step of changing a first pupil filter with a first pupil function to a second pupil filter with a second pupil function is accomplished by rotating the pupil filter.

14. The pattern forming method according to claim 1, wherein the step of changing a pupil filter with a first pupil function to a pupil filter with a second pupil function involves physically replacing a first pupil filter with a second pupil filter.

15. The pattern forming method according to claim 1, wherein the different pupil functions are realized using a patterned opaque layer, a partially phase-retarding layer on a transparent substrate and a stencil mask opaque to light.

16. The pattern forming method according to claim 15, wherein the step of changing a first pupil filter with a first pupil function to a second pupil filter with a second pupil function is accomplished by rotating the stencil mask.

17. The pattern forming method according to claim 1, wherein the pupil filter having the first pupil function and the pupil filter having the second pupil function are formed from by a patterned opaque, partially absorbing and phase-retarding layer on an optically birefringent substrate, and wherein a polarization of light used in the step of illuminating is changed during the step of continuing illuminating.

18. A method for forming a pattern onto a substrate comprising the steps of:

providing a mask having a predetermined pattern formed thereon;

providing a pupil filter between the mask and the substrate, the pupil filter having a center and a pupil function with an asymmetric or anti-symmetric phase transmittance distribution with respect to its center;

illuminating the mask in a substantially perpendicular direction.

19. The method according to claim 18, wherein the pupil filter has a transparent substrate that is partially covered by a phase retarding layer, and wherein the method further comprises the step of laterally translating the transparent substrate in order to illuminate different portions of the transparent substrate.

20. A method for forming a pattern onto a substrate comprising the steps of:

providing a mask having a predetermined pattern formed thereon;

providing a pupil filter between the mask and the substrate, the pupil filter having a center and a pupil function with an anti-symmetric amplitude transmittance distribution with respect to its center;

illuminating the mask and changing filters as necessary to form the pattern desired.

* * * * *